US010103008B2

(12) United States Patent
Chandler

(10) Patent No.: US 10,103,008 B2
(45) Date of Patent: Oct. 16, 2018

(54) CHARGED PARTICLE BEAM-INDUCED ETCHING

(71) Applicant: FEI Company, Hillsboro, OR (US)

(72) Inventor: Clive D. Chandler, Portland, OR (US)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/993,665

(22) Filed: Jan. 12, 2016

(65) Prior Publication Data

US 2017/0200589 A1  Jul. 13, 2017

(51) Int. Cl.
| | |
|---|---|
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C23F 1/00 | (2006.01) |
| H01J 37/32 | (2006.01) |
| H01L 21/02 | (2006.01) |
| H01L 39/24 | (2006.01) |
| H01J 37/305 | (2006.01) |
| H01L 21/306 | (2006.01) |
| H01L 21/3065 | (2006.01) |

(52) U.S. Cl.
CPC .... *H01J 37/32522* (2013.01); *H01J 37/3056* (2013.01); *H01J 37/3244* (2013.01); *H01J 37/32715* (2013.01); *H01L 21/02315* (2013.01); *H01L 21/02689* (2013.01); *H01L 21/3065* (2013.01); *H01L 21/30621* (2013.01); *H01L 39/2477* (2013.01); *H01J 2237/08* (2013.01); *H01J 2237/2002* (2013.01); *H01J 2237/3174* (2013.01); *H01J 2237/31745* (2013.01); *H01J 2237/3341* (2013.01)

(58) Field of Classification Search
None
See application file for complete search history.

(56) References Cited

U.S. PATENT DOCUMENTS

| | | |
|---|---|---|
| 5,055,696 A | 10/1991 | Haraichi et al. |
| 5,188,705 A | 2/1993 | Swanson et al. |
| 5,683,547 A | 11/1997 | Azuma et al. |
| 5,851,413 A | 12/1998 | Casella et al. |
| 5,874,011 A | 2/1999 | Ehrlich |
| 6,211,527 B1 | 4/2001 | Chandler |

(Continued)

FOREIGN PATENT DOCUMENTS

| | | |
|---|---|---|
| WO | 0022670 | 4/2000 |
| WO | 2000022670 A1 | 4/2000 |

OTHER PUBLICATIONS

K. Edinger, "Gas Assisted Etching of Copper with Focused Ion Beams", J. Vac. Sci. Technol, B 17(6), Nov. 1999, 5 pages.

(Continued)

*Primary Examiner* — Stephanie P Duclair
(74) *Attorney, Agent, or Firm* — Scheinberg & Associates, P.C.; Michael O. Scheinberg

(57) ABSTRACT

A micromachining process includes exposing the work piece surface to a precursor gas including a compound having an acid halide functional group; and irradiating the work piece surface with a beam in the presence of the precursor gas, the precursor gas reacting in the presence of the particle beam to remove material from the work piece surface.

17 Claims, 3 Drawing Sheets

(56) References Cited

U.S. PATENT DOCUMENTS

| | | |
|---|---|---|
| 6,268,608 B1 | 7/2001 | Chandler |
| 6,322,672 B1 | 11/2001 | Shuman et al. |
| 6,753,538 B2 | 6/2004 | Musil et al. |
| 7,241,361 B2 | 7/2007 | Keller et al. |
| 8,835,880 B2 | 9/2014 | Chandler et al. |
| 9,150,961 B2 | 10/2015 | Chandler et al. |
| 2002/0102861 A1 | 8/2002 | Bassom et al. |
| 2003/0047691 A1 | 3/2003 | Musil et al. |
| 2003/0100143 A1* | 5/2003 | Mulligan ............ H01L 21/304 438/113 |
| 2004/0226814 A1 | 11/2004 | Stewart et al. |
| 2006/0027249 A1* | 2/2006 | Johnson ............ C23C 16/4405 134/1.1 |
| 2006/0045987 A1 | 3/2006 | Chandler et al. |
| 2006/0228634 A1 | 10/2006 | Bret et al. |
| 2008/0314871 A1 | 12/2008 | Toth et al. |
| 2009/0111036 A1 | 4/2009 | Stewart et al. |
| 2010/0032302 A1 | 2/2010 | Holtermann et al. |
| 2010/0197142 A1 | 8/2010 | Randolph et al. |
| 2011/0031655 A1 | 2/2011 | Toth et al. |
| 2011/0070381 A1 | 3/2011 | Toth et al. |
| 2011/0114665 A1 | 5/2011 | Chandler et al. |
| 2011/0183523 A1* | 7/2011 | Auth ................ H01L 21/31116 438/706 |
| 2012/0003394 A1 | 1/2012 | Mulders et al. |
| 2012/0308740 A1 | 12/2012 | Randolph et al. |
| 2013/0248356 A1 | 9/2013 | Rue |
| 2013/0248490 A1 | 9/2013 | Rasmussen et al. |
| 2014/0357088 A1* | 12/2014 | Rue ................... H01L 21/76892 438/723 |
| 2014/0363978 A1* | 12/2014 | Martin ................ H01J 37/3053 438/712 |
| 2015/0294885 A1 | 10/2015 | Rue et al. |
| 2015/0330877 A1 | 11/2015 | Schmidt et al. |

OTHER PUBLICATIONS

J.C. Gonzalez et al., "Chemically Enhanced Focused Ion Beam Micromachining of Copper", J. Vac. Sci. Technol. B 19(6), Nov. 2001, 4 pages.

Utke, Ivo, et al., "Gas-assisted focused electron beam and ion beam processing and fabrication," Journal of Vacuum Science and Technology Part B, Aug. 11, 2008, pp. 1197-1276, vol. 26, No. 4.

* cited by examiner

CHARGED PARTICLE BEAM-INDUCED ETCHING

TECHNICAL FIELD

The present invention relates to charged particle beam processing, and in particular to chemical-assisted, beam-induced etching processes.

BACKGROUND OF THE INVENTION

Micromachining may performed by directing beams, such as ion beams, electron beams, laser beams, molecular beams, cluster beams, or atom beam toward a work piece. For example, focused ion beam systems are used in forming, shaping or altering microscopic structures, such as electronic circuit components and micro-electromechanical system (MEMS) structures. A focused ion beam can be focused to a very small spot on the work piece and then scanned over the surface in a desired pattern to remove material.

As an ion impinges on the work piece surface, its momentum is transferred resulting in the removal of one or more surface atoms by a process called "sputtering." By selecting a pattern of a given overall shape, for example a horizontal raster pattern, a correspondingly shaped area of surface material can be removed. Often several successive layers of a semiconductor device are removed in a given area in order to reach and possibly sever an underlying layer. Because an ion beam can be finely focused, it can create a fine structure.

The above described physical sputtering process can be enhanced by the introduction of an etch precursor gas. The gas is adsorbed on the surface of the work piece prior to arrival of the ions and the gas reacts chemically with the surface material in the presence of the ion beam to facilitate sputtering and reduce redeposition of the sputtered material. The ion beam may induce decomposition of the precursor gas into reaction products, some of which react with the work piece material. A precursor gas chemically reacts to form volatile compounds, resulting in a substantial increase in sputtering rates. For instance, an enhancement factor in sputtering of silicon with a chlorine precursor gas has been reported of approximately fourteen, i.e., the gas-enhanced sputtering occurs approximately fourteen times as fast as sputtering without the introduction of the gas. Gas-enhanced sputtering is also less subject to redeposition of sputtered material. The enhancement factor for metal surfaces, such as conductive layers in a semiconductor device, may be even greater.

Electron beams typically lack the momentum to sputter material, but can be used to initiate a reaction between the precursor gas and the work piece, and thereby etch a work piece surface. See, for example, U.S. Pat. No. 6,753,538 for "Electron Beam Processing" to Musil et al. which is assigned to the present applicant. Other types of beams can also be used to initiate the reaction between the precursor gas and the work piece to etch the surface, including laser beams, as described for example, in U.S. Pat. No. 5,874,011 to Ehrlich for "Laser-induced Etching of Multilayer Materials" and cluster beams, as described in U.S. Pat. No. 8,835,880 to Chandler, et al. for "Charged Particle-beam Processing Using a Cluster Source," which is assigned to the present applicant. Additional types of beams, such as beams of neutral atom or molecules can also be used to initiate reactions between the precursor gas and the surface. Beams can be focused to a fine point, or can be broad to process larger areas.

To be useful as an etch precursor for beam processing, the gas molecules should have very specific properties: they need to stick to the surface for a sufficient time to react with the beam, but they must not form a thick layer that shields the surface from the beam. The gas should not react spontaneously with the work piece surface material in the absence of the beam. The precursor dissociation products should form a volatile compound with the work piece material. Etch precursors are typically specific to a particular work piece materials, and so can be used for selectively etching certain materials. That is, the beam-induced etching preferentially etching some materials over other materials, facilitating, for example, etches away one layer without destroying an underlying layer.

Halogen-containing precursor gases are often used for beam-induced etching because the reaction products tend to be gaseous and can be removed from a sample vacuum chamber by the vacuum pump. Elemental halogens, such as chlorine or iodine, are used as precursor gases but have disadvantages. The introduction of chlorine or fluorine gas creates a safety hazard because of the combined toxicity and high vapor pressure of the gas. Furthermore, chlorine gas is often chemically reactive with the entire work piece surface and may undesirably attack areas adjacent to the ion beam position, resulting in a lack of contrast between machined and non-machined areas. Moreover, chlorine causes corrosion of typical materials used in construction of the chamber and components within as well. Chlorine and bromine require handling of in halogen-compatible hardware, which is typically expensive. Handling tanks of toxic gas at high pressures is awkward even in a carefully monitored laboratory environment, requiring the use of chlorine leak sensors.

U.S. Pat. No. 5,188,705 to Swanson et al. for "Method of Semiconductor Device Manufacture" describes the use of iodine vapor as a precursor gas to replace chlorine and fluorine. Iodine has a long residence time within a charged particle beam system. This causes corrosion of components within the chamber, particularly if exposed to water vapor from air.

To avoid some of the disadvantages of elemental halogen gases, other halogen-containing precursor gases have been used as precursor gases. For example, WO00/022670 of Chandler, for "Integrated Circuit Rewiring Using Gas-Assisted FIB Etching," describes the use of trifluoroacetamide and trifluoroacetic acid as precursor gases. These compounds have lower toxicity and more convenient material handling properties. Currently, no similar compounds are known as chlorine or bromine sources. As an example, trichloroacetic acid is not an effective etch precursor gas.

$XeF_2$ has been used as a precursor gas for beam-induced etching as described, for example, in U.S. Pat. No. 6,753,538 for "Electron Beam Processing" to Musil et al. $XeF_2$, however, spontaneously etches many materials, including silicon and TaN. $XeF_2$ is highly corrosive and toxic, requiring special handling and safety procedures. $XeF_2$ cannot be mixed with many common gases used for residual carbon removal and surface species control. Moreover, large quantities of $XeF_2$ cause instability in some differentially pumped beam systems because of poor ion getter pumping of xenon.

One application for focused ion beam etching is the preparation of thin samples for viewing on a transmission electron microscopy (TEM). The beam is directed towards the work piece surface to form the thin sample, typically without using an etch-assisting gas. When the work piece is composed of a III-V semiconductor compound, the beam etches the group V elements (N, P, As . . . ) elements at a higher rate than it etches the group III elements (Ga, In), because the group V elements have greater volatility. In a work piece including Ga or in, for example, ion beam sputtering can lead to the formation of Ga droplets and In crystals by diffusion of excess Ga and In within the sample. FIG. 1A shows a work piece 104, in which etching has caused In crystals 102 to form. FIG. 1B shows a similar prior art work piece 208, in which a gallium droplet 210 has formed.

It would be useful to find a system for beam-induced etching that solves some of the problems described above.

SUMMARY OF THE INVENTION

An object of the present invention, therefore, is to provide an improved method for beam-induced etching.

A work piece surface is exposed to a precursor gas comprising an acid halide functional group and the work piece surface is irradiated with a beam. The precursor gas reacts in the presence of the particle beam to remove material from the work piece surface.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1A:
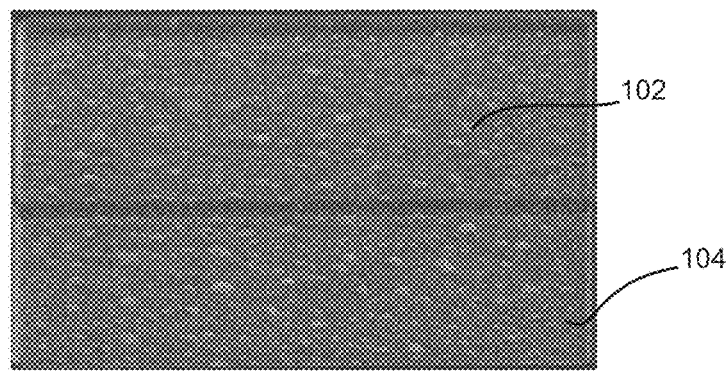
FIG. 1A shows indium crystals formed on a work piece processed using a focused ion beam without an etch-enhancing gas.
Figure 1B:
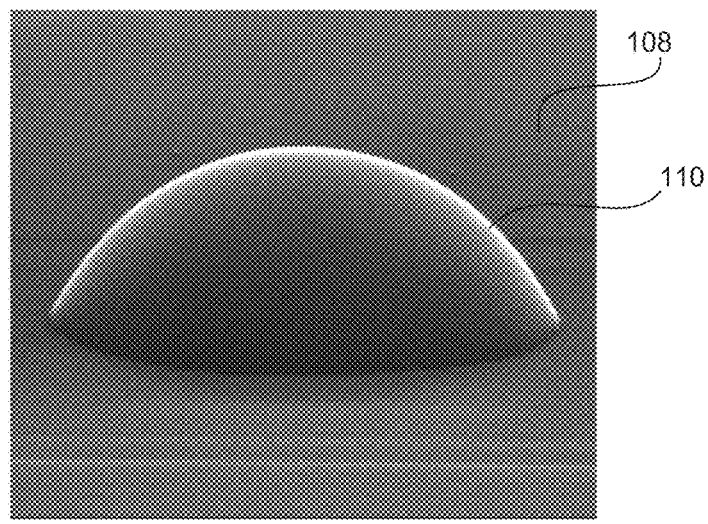
FIG. 1B shows a gallium droplet formed on a work piece processed using a focused ion beam without an etch-enhancing gas.

Many compounds have been investigated as potential halogen containing precursor gases. The usefulness of many such compounds is limited due to the high strength of the carbon-chlorine bond, such as those in trichloroacetic acid.

Applicant has found that compounds containing an acid halide functional group can be used as precursor gases for beam-induced etching. The acid halide can be, for example, an acid chloride or an acid bromide. For example, oxalyl halides make suitable precursors. The decomposition products include CO and the associated halogen, both of which are volatile. For example, Oxalyl chloride and oxalyl bromide are effective precursor gases. The vapor pressure of the oxalyl halides is such as to provide a residence time on a surface that is sufficiently long to allow the beam to react with the precursor, yet sufficiently short to reduce corrosion on components within the vacuum chamber.

The use of acid halides as precursor gases reduces dangers inherent in the use of the molecular halogens. Acid halides tend to be far less corrosive than the halogens, allowing system construction from less expensive materials. For example, oxalyl halides are compatible with 316-type or 304-type stainless steel, as compared to elemental bromine, which must be handled in expensive Hastalloy hardware.

Lower molecular weight acid halides are preferred in some applications because they tend to have a higher vapor pressure, and so have a lower residence time within the system, reducing corrosion. Higher molecular weight acid halides tend to promote significant carbon deposition on the sample surface, competing with the desired removal of material.

A precursor gas compound may have more than one acid halide functional group per molecule. The precursor gas can be a mixture of acid halides. In addition, a precursor gas may be a mixture of different gases. In some embodiments, a precursor gas mixture contains ammonia ($NH_3$) in addition to the acid halide. The addition of ammonia can increase the volatility of the etching products. For example, when etching copper, ammonia increases the volatility of copper halide etch products. Ammonia can also provide resistance to spontaneous etching on susceptible work piece materials exposed to the etching gas but not the charged particle beam.

Applicants have found that the acid halide derivatives of oxalic acid, specifically oxalyl chloride and oxalyl bromide, are preferable for use as acid halide etching precursor gases. beam-induced decomposition of an oxalyl halide produces carbon monoxide, and the accompanying halide.

Tables 1 and 2 below show etch enhancement rates for gas-assisted ion beam etching relative to unassisted etching for focused ion beam etching of aluminum and silicon, respectively. For example, an enhancement value of 2 means etching proceeds twice as fast as unassisted etching.

TABLE 1

Enhancement of Aluminum Etching with Charge Particle Beam

| Current Density ($pA/\mu m^2$) | $C_2O_2Br_2$ Enhancement | $C_2O_2Cl_2$ Enhancement | $C_2O_2Cl_2$ Enhancement −10° C. |
|---|---|---|---|
| 1 | 6.4 | 3.5 | 8.5 |
| 2.3 | 4.5 | 1.5 | 4.2 |
| 4 | 3.5 | 1.2 | 3.2 |
| 6 | 3.2 | 1.2 | 2.9 |

TABLE 2

Enhancement of Silicon Etching with Charge Particle Beam

| Current Density ($pA/\mu m^2$) | $C_2O_2Br_2$ Enhancement | $C_2O_2Cl_2$ Enhancement | $C_2O_2Cl_2$ Enhancement −10° C. |
|---|---|---|---|
| 1 | 6 | 8.5 | 7.8 |
| 2.3 | 3.5 | 1.5 | 4.3 |
| 4 | 3 | 1.2 | 2.5 |
| 6 | 3 | 1.2 | 2.1 |

Table 1 shows the relative etch enhancement rate of oxalyl chloride and oxalyl bromide when etching aluminum at various current densities. Higher beam currents tend to deplete the precursor adsorbed on the workpiece surface, leading to a non-linear relationship between current density and etching rate. The etch rate increases with increasing current density, but the enhancement value decreases. Etching was performed using a focused beam of gallium ions from a liquid metal ion source, the gallium ions having landing energies of 30 keV. Table 2 shows a table similar to that of Table 1, for etching silicon.

Table 3 shows removal rates of material from an aluminum work piece using oxalyl bromide, showing the relative rates of material removal between unassisted etching and gas-assisted etching for a variety of beam currents.

TABLE 3

| Current Density (pA/$\mu m^2$) | Gas | Removal Rate ($\mu m^3$/nC) | Enhancement with gas |
|---|---|---|---|
| 1.02 | None | .043 | |
| 1.02 | oxalyl bromide | 0.278 | 6.4 |
| 2.3 | None | 0.113 | |
| 2.3 | oxalyl bromide | 0.517 | 4.6 |
| 4.09 | None | 0.157 | |
| 4.09 | oxalyl bromide | 0.554 | 3.5 |
| 6.38 | None | 0.189 | |
| 6.38 | oxalyl bromide | 0.605 | 3.2 |

While the relatively high vapor pressure of some precursors, particularly the chlorine compounds, reduces system corrosion, it also causes more rapid depletion of the adsorbed precursor layer. That is, the adsorbed precursor desorbs or reacts with the beam faster than the gas molecules can be replenished by adsorption, exhausting the precursor supply at the beam dwell point. The higher the beam current density, the faster the precursor depletes.

Improved coverage on the surface for some precursors can be achieved by cooling the work piece to increase the residence time of the precursor molecules on the surface. Precursor molecules adsorb onto the surface and remain, that is, do not thermally desorb, for a longer period of time when the work piece is cooled. However, the temperature is preferably not so low as to inhibit desorption of the reaction products. Nor should the temperature be at or below the condensation point of the precursor gas. Condensed material collecting on the work piece surface interferes with desorption of reaction products from that same surface; if desorption does not proceed, redeposition of material and competition for surface sites can occur, preventing new precursor molecules from reaching the surface. Condensed material on the work piece surface also hinders imaging of features on that surface, making it hard to see when etching has proceeded far enough.

In some embodiments, the workpiece is cooled below room temperature to increase the surface coverage of precursor, enhancing the etch rate even at high current densities. For example, the work piece can be cooled to around 0° C. or below, minus 10° C. or below, or 20° C. or below. This is particularly useful when etching with oxalyl chloride, as shown in Tables 1 and 2, because of its higher vapor pressure.

Tables 1 and 2 show the oxalyl chloride etch enhancement from cooling the work piece. Desorption occurs due to both thermal processes and to athermal processes, such particle stimulated desorption, making it difficult to determine a minimum temperature at which the reaction products desorb theoretically. The optimum temperature can be determined experimentally by measuring etch rates at different work piece temperature and optimizing the etch rate.

In some embodiments, other acid halides are used. For example, acetyl chloride or acetyl bromide can be used as precursor gases. In addition, acid halide precursor gases may provide other benefits than etch rate increase, such as the inhibition of formation of residues such as gallium droplets and indium crystals.

Figure 2:
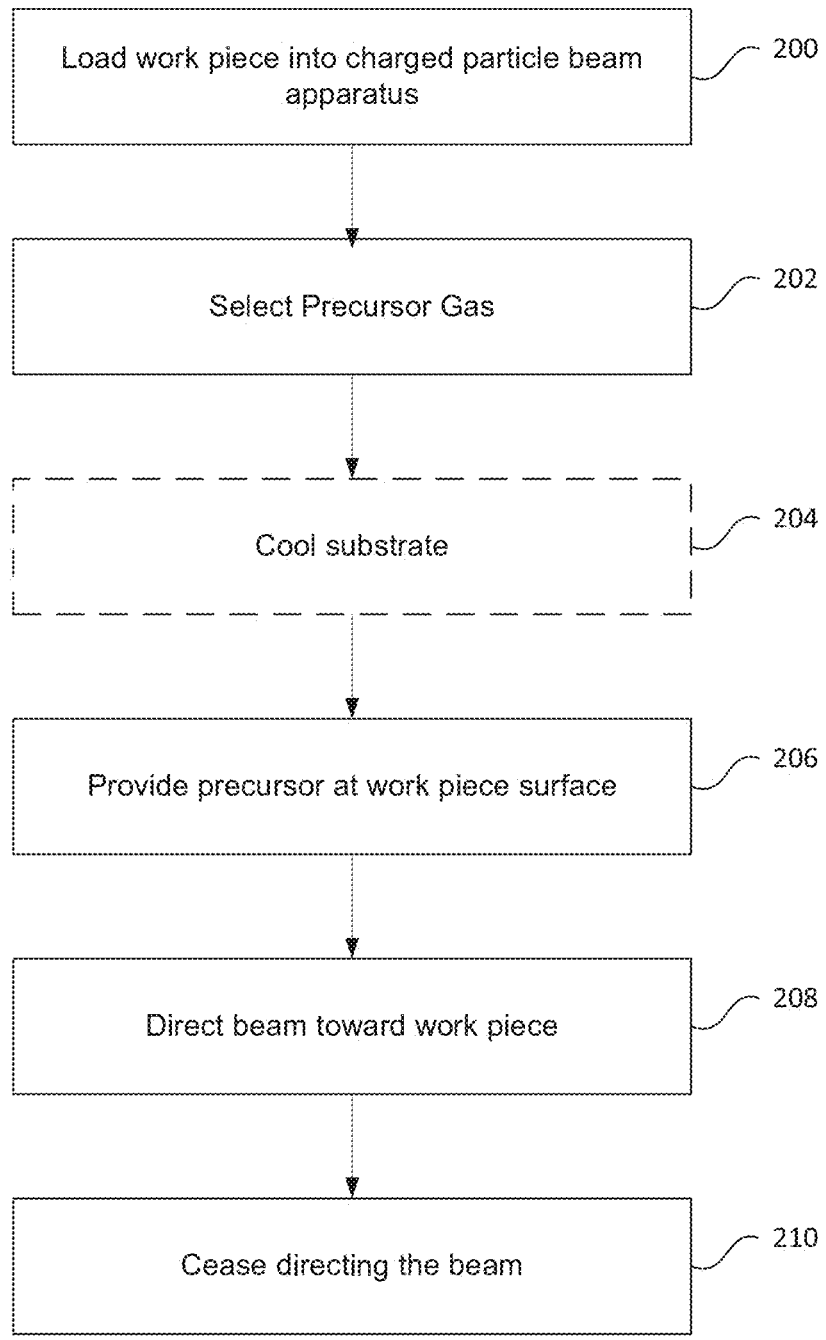
FIG. 2 is a flowchart showing the steps of a preferred embodiment of the present invention.

FIG. 2 illustrates the steps of a preferred beam etching process. The process starts in step 200, with loading a work piece into an apparatus, such as an SEM, a transmission electron microscope (TEM), a focused ion beam system, or a laser system. In step 202, a precursor gas is selected. Optionally in step 204, the work piece surface is cooled to a temperature determined by the properties of the precursor gas chosen and the work piece material. In step 206, the selected precursor gas is provided at the work piece surface. The precursor gas may be directed toward the work piece by a needle positioned near the region of the work piece to processed, as described, for example, in U.S. Pat. Pub. 20130248490 of Rasmussen et al. for a "Multiple Gas Injection System," which is assigned to the present Applicant. When the precursor gas is directed to the work piece through a needle, the flow rate of is such the background pressure in the vacuum chamber, which is typically about $10^{-8}$ mbar without gas injection, rises to about $5.5 \times 10^{-5}$ mbar.

In step 208, the work piece surface is irradiated in a pattern with a beam and the precursor gas reacts in the presence of the ion beam to remove material from the work piece surface. The work piece is etched only where impacted by the beam, so a pattern can be etched having a resolution comparable to the spot size of the beam. In one embodiment, the beam is a gallium ion beam from a liquid metal ion source. The beam energy is typically 30 keV and the beam is operated with a dwell of 200 ns, an overlap of 150%, and a pattern current density in the range of between 1 to 10 pA/$\mu m^2$. Other beam parameters are possible as well. In some cases, the use of low beam energy can produce better selectivity and increase the efficiency of material removal. A beam of argon or other ions from a plasma ion source, such as the Vion plasma ion source from FEI Company, can also be used. In other embodiments, the ion energy is between about 1 keV to 50 keV, more preferably between 20 keV and 40 keV. Any beam-producing system that provides for providing a precursor gas at the work piece surface. The beam can be focused or collimated, narrow or broad. In step 210, the beam ceases to be directed to the work piece.

Figure 3:
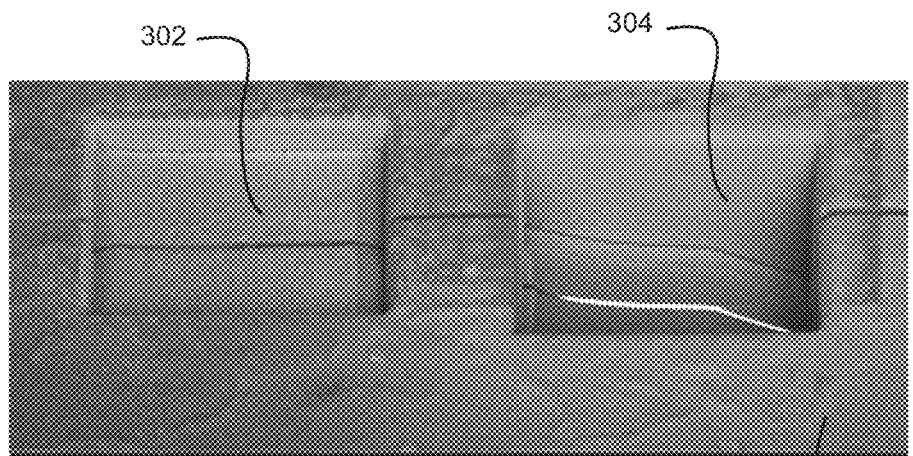
FIG. 3 is a photomicrograph of a workpiece etched with and without an etching gas.

FIG. 3 shows a work piece surface 306, with two etch pits, one pit 302 created using unassisted etching, and one pit 304 created using an acid halide precursor for gas-assisted etching, in accordance with embodiments of the invention. A similar beam dose was used to create each etch pit. Pit 304 is deeper and has a smoother surface than pit 302, demonstrating the effectiveness of ion beam etching assisted by an acid halide precursor gas.

Figure 4:
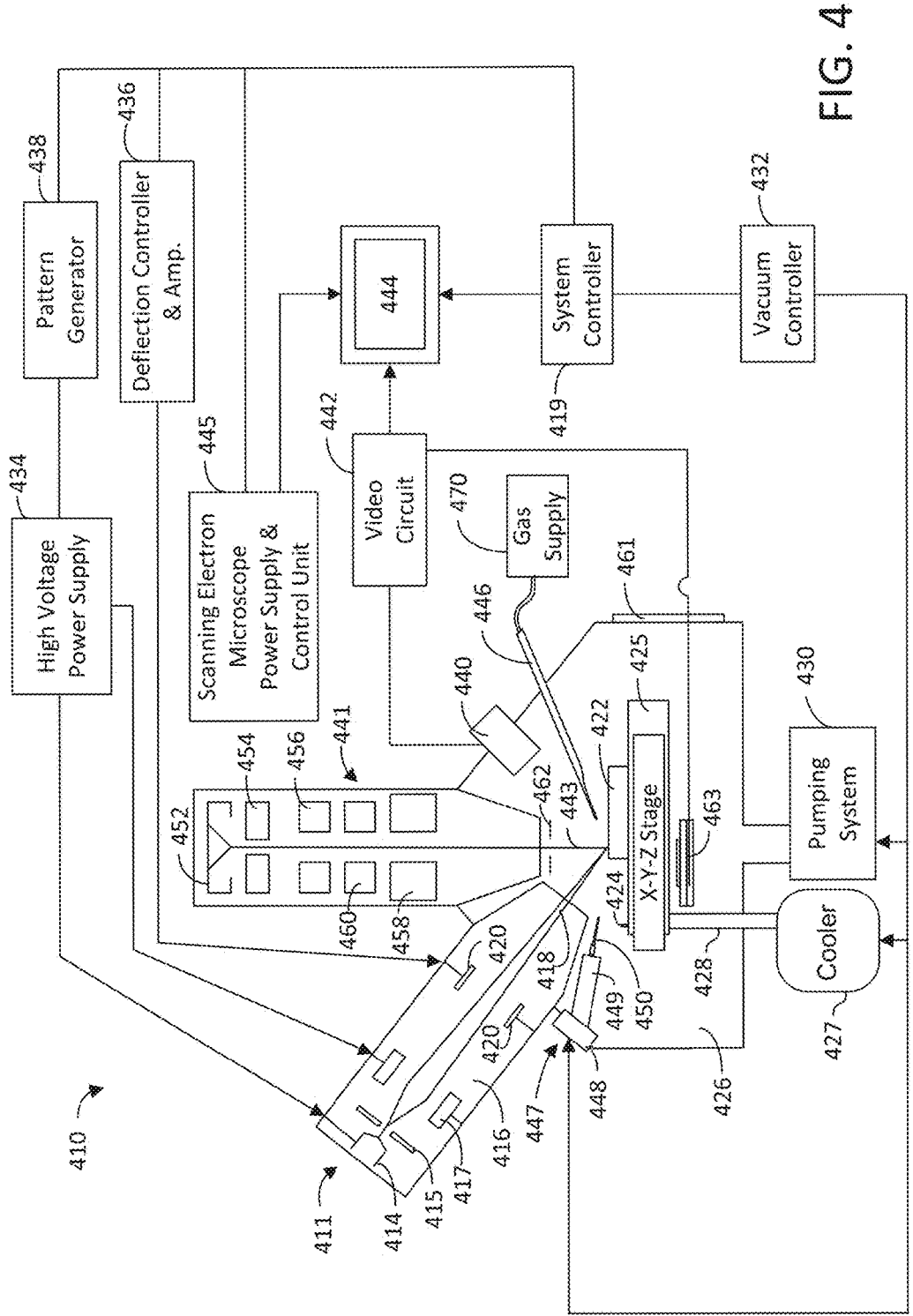
FIG. 4 shows schematically a typical dual beam system that can be used to implement some embodiments of the invention.

FIG. 4 shows a typical dual beam system 410 suitable for practicing the present invention and having two charged particle beam sources and two charged particle beam columns, although only a single beam is necessary. Dual beam system 410 includes a vertically mounted scanning electron microscope ("SEM") 441 and a focused ion beam (FIB) system 411 mounted at an angle of approximately 52 degrees from the vertical. Suitable dual beam systems are commercially available, for example, from Applicant, FEI Company, Hillsboro, Oreg. While an example of suitable hardware is provided below, the invention is not limited to being implemented in any particular type of hardware.

A scanning electron microscope 441, along with power supply and control unit 445, is provided with the dual beam system 410. An electron beam 443 is emitted from a cathode 452 by applying voltage between cathode 452 and an anode 454. Electron beam 443 is focused to a fine spot by means of a condensing lens 456 and an objective lens 458. Electron beam 443 is scanned two-dimensionally on the specimen by means of a deflection coil 460. Operation of condensing lens 456, objective lens 458, and deflection coil 460 is controlled by power supply and control unit 445.

Electron beam 443 can be focused onto work piece 422, which is on movable X-Y stage 425 within a lower sample chamber 426. Stage 425 preferably is connected to a cooler 427, such as a source of liquid nitrogen or a Peltier cooler, by a thermal conduit 428. When the electrons in the electron beam strike work piece 422, secondary electrons are emitted. These secondary electrons are detected by secondary electron detector 440 as discussed below. An optional backscattered electron detector 462 can detect back-scattered electrons. An optional STEM detector 463, located beneath the TEM sample holder 424 and the stage 425, can collect electrons that are transmitted through the sample mounted on the TEM sample holder when stage 425 is moved out of the path of beam 443.

FIB system 411 comprises an evacuated housing containing an ion focusing column 416 that connects to lower sample vacuum chamber 426. Ion focusing column 416 contains an ion source 414 and ion optical elements, including an extraction electrode 415, a focusing element 417, and deflection elements 420, which together produce and direct a focused ion beam 418 toward work piece 422. The axis of ion focusing column 416 is tilted 52 degrees from the axis of the electron microscope 441.

Stage 425 can also support one or more TEM sample holders 424 so that a sample can be extracted from the semiconductor device and moved to a TEM sample holder. Stage 425 can preferably move in a horizontal plane (X and Y axes) and vertically (Z axis). Stage 425 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 461 can be opened for inserting work piece 422 onto stage 425 and also for servicing an internal gas supply reservoir, if one is used. The door is interlocked so that it cannot be opened if the system is under vacuum.

Ion pumps (not shown) are employed for evacuating ion focusing column 416 and the interior of SEM 411. The lower sample vacuum chamber 426 is evacuated using turbomolecular and mechanical pumping system 430 under the control of vacuum controller 432. The vacuum system provides within lower sample vacuum chamber 426 a vacuum of between approximately $1 \times 10^{-7}$ mbar and $7 \times 10^{-4}$ mbar. If a precursor gas is used, the chamber background pressure may rise, typically to about $10^{-5}$ mbar to $10^{-4}$ mbar, depending on the precursor.

A high voltage power supply provides an appropriate voltage for energizing and focusing ion beam 418. High voltage power supply 434 is connected to liquid metal ion source 414 as well as to appropriate electrodes in ion beam focusing column 416 for forming an approximately 1 keV to 60 keV ion beam 418 and directing the same toward a work piece. Deflection controller and amplifier 436, operated in accordance with a prescribed pattern provided by pattern generator 438, is coupled to deflection plates 420 whereby ion beam 418 may be controlled manually or automatically to trace out a corresponding pattern on the upper surface of work piece 422. In some systems the deflection plates are placed before the final lens, as is well known in the art. Beam blanking electrodes (not shown) within ion beam focusing column 416 cause ion beam 418 to impact onto a blanking aperture (not shown) instead of work piece 422 when a blanking controller (not shown) applies a blanking voltage to the blanking electrode.

The liquid metal ion source 414 typically provides a metal ion beam of gallium. The source typically is capable of being focused into a sub one-tenth micrometer wide beam at work piece 422 for either modifying the work piece 422 by ion milling, enhanced etching, material deposition, or for the purpose of imaging the work piece 422. The ion source may also be a plasma source, such as the plasma source described in U.S. Pat. No. 7,241,361 to Keller et al, for a "Magnetically Enhanced, Inductively Coupled Plasma Source for a Focused Ion Beam System," which is assigned to the present applicant. A plasma ion source can be used to form a beam from a variety of ion species, such argon, xenon, or helium.

A charged particle detector 440, such as an Everhart Thornley or multi-channel plate, used for detecting secondary ion or electron emission is connected to a video circuit 442 that supplies drive signals to video monitor 444 and receives deflection signals from controller 419 or from SEM control unit 445. The location of charged particle detector 440 within lower chamber 426 can vary in different embodiments. For example, a back scattered electron detector is typically coaxial with the electron beam and includes a hole for allowing the electron beam to pass. In other embodiments, secondary particles can be collected through a final lens and then diverted off axis for collection.

A micromanipulator 447, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 447 may comprise precision piezoelectric positioners or electric motors 448 positioned outside the vacuum chamber to provide X, Y, Z, and theta control of a portion 449 positioned within the vacuum chamber. The micromanipulator 447 can be fitted with different end effectors for manipulating small objects. In the embodiments described herein, the end effector is a thin probe 450.

System 410 includes a source of a precursor gas comprises an acid halide, such as an acid chloride or an acid bromide. The gas source may be a source of, for example, an oxalyl chloride, oxalyl bromide, acetyl chloride or acetyl bromide. A gas delivery system 446 extends into lower chamber 426 for introducing and directing a gaseous vapor toward work piece 422. One gas injection system is described in U.S. Pat. Pub. 2013/0248490 of Rasmussen et al for a "Multiple Gas Injection System," which is assigned to the present applicant, and which is hereby incorporated by reference. Some of the acid halides described herein, such as oxalyl chloride and oxalyl bromide, are liquids at room temperature. The liquids are stored in containers that are connected to the gas injection system, each container containing a liquid comprising a gas source. The vapor pressures of oxalyl chloride and oxalyl bromide are sufficiently high at room temperature that adequate gas for processing flows from the liquid containers, and a needle valve or a pulse-width-modulated microvalve can be used to throttle the flow to the desired flow rate. U.S. Pat. No. 9,150,961 to Chandler, et al. for a "Gas Delivery for Beam Processing Systems" describes another gas delivery system that includes a cabinet that can store multiple containers for holding liquids that are used as gas sources and that uses pulse-width-modulated microvalves to control the flow rate.

A system controller 419 controls the operations of the various parts of dual beam system 410. Through system controller 419, a user can cause ion beam 418 or electron beam 443 to be scanned in a desired manner through commands entered into a conventional user interface (not shown). Alternatively, system controller 419 may control dual beam system 410 in accordance with programmed instructions. In some embodiments, dual beam system 410 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

While the description above describes the use of a focused ion beam to activate the precursor, the invention is not limited to any particular type of beam providing the activation. For example, a laser beam or a cluster beam can also be used. An electron beam may also be suitable.

Although the present invention and its advantages have been described in detail, it should be understood that various changes, substitutions and alterations can be made herein without departing from the scope of the invention as defined by the appended claims. Moreover, the scope of the present application is not intended to be limited to the particular embodiments of the process, machine, manufacture, composition of matter, means, methods and steps described in the specification. The use of the term "or" in the claims is not intended to be an "exclusive or," that is, combination of the alternative are within the scope of the claim. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of beam-initiated etching of a work piece, comprising:
   exposing the work piece surface to a precursor gas comprising oxalyl chloride, oxalyl bromide, of a combination thereof; and
   irradiating the work piece surface with a beam in the presence of the precursor gas such that the beam induces decomposition of the precursor gas in the presence of the beam,
   wherein a decomposition product of the precursor gas etches the work piece by undergoing a reaction with the work piece surface that results in formation of a volatile compound comprising material from the work piece, the formation of the volatile compound removing the material from the work piece.

2. The method of claim 1 in which:
   the work piece is positioned in a vacuum chamber; and
   irradiating the work piece surface with the beam comprises irradiating the work piece surface with a focused ion beam.

3. The method of claim 1 in which irradiating the work piece surface with the beam comprises irradiating the work piece surface with a laser beam.

4. The method of claim 1, further comprising cooling the work piece to below room temperature.

5. The method of claim 4, wherein cooling the work piece to below room temperature comprises cooling the work piece to a temperature of less than or equal to minus 10° C.

6. The method of claim 1, wherein the precursor gas further comprises a mixture of gases.

7. The method of claim 6, wherein the mixture of gases includes ammonia gas.

8. The method of claim 1, wherein:
   the work piece comprises a group III-V compound containing indium or gallium; and
   the precursor gas comprises a precursor gas that prevents the formation of indium crystals or gallium droplets.

9. A method of etching a workpiece using a charged particle beam, comprising:
   exposing a surface of a workpiece to a precursor gas comprising at least one compound selected from the group consisting of oxalyl chloride and oxalyl bromide; and
   irradiating the surface of the workpiece with a beam in the presence of the precursor gas, the beam inducing decomposition of the precursor gas, the precursor gas decomposing in the presence of the beam,
   wherein a decomposition product of the precursor gas etches the workpiece by undergoing a reaction with the surface of the workpiece that forms a volatile compound comprising material from the workpiece, the formation of the volatile compound removing the material from the workpiece.

10. The method of claim 9, wherein the precursor gas comprises at least one compound selected from the group consisting of acetyl chloride and acetyl bromide.

11. The method of claim 10 in which:
    the workpiece is positioned in a vacuum chamber; and
    irradiating the surface of the workpiece with the beam comprises irradiating the surface of the workpiece with a focused ion beam.

12. The method of claim 10 in which irradiating the surface of the workpiece with the beam comprises irradiating the surface of the workpiece with a laser beam.

13. The method of claim 10, further comprising cooling the workpiece to below room temperature.

14. The method of claim 13, wherein cooling the workpiece to below room temperature comprises cooling the workpiece to a temperature of less than or equal to minus 10° C.

15. The method of claim 10, wherein the precursor gas comprises a mixture of gases.

16. The method of claim 15, wherein the mixture of gases comprises ammonia.

17. The method of claim 10, wherein:
    irradiating the surface of the workpiece includes irradiating a workpiece comprising a group III-V compound that includes indium or gallium; and
    the precursor gas prevents the formation of indium crystals or gallium droplets.

* * * * *